United States Patent
Hennessy et al.

(10) Patent No.: US 11,439,959 B2
(45) Date of Patent: *Sep. 13, 2022

(54) POROUS FLAT DEFORMATION-RESISTANT MEMBRANE

(71) Applicant: GLOBAL LIFE SCIENCES SOLUTIONS USA LLC, Marlborough, MA (US)

(72) Inventors: William A Hennessy, Schenectady, NY (US); Douglas Albagli, Clifton Park, NY (US)

(73) Assignee: GLOBAL LIFE SCIENCES SOLUTIONS USA, LLC, Marlborough, MA (US)

( * ) Notice: Subject to any disclaimer, the term of this patent is extended or adjusted under 35 U.S.C. 154(b) by 50 days.

This patent is subject to a terminal disclaimer.

(21) Appl. No.: 16/842,402

(22) Filed: Apr. 7, 2020

(65) Prior Publication Data
US 2021/0308634 A1    Oct. 7, 2021

(51) Int. Cl.
| | |
|---|---|
| *B01D 71/64* | (2006.01) |
| *B01D 67/00* | (2006.01) |
| *G03F 7/00* | (2006.01) |
| *B01D 69/06* | (2006.01) |
| *B01D 69/10* | (2006.01) |

(52) U.S. Cl.
CPC ......... *B01D 71/64* (2013.01); *B01D 67/0034* (2013.01); *G03F 7/00* (2013.01); *B01D 69/06* (2013.01); *B01D 69/10* (2013.01); *B01D 2325/02* (2013.01); *B01D 2325/08* (2013.01)

(58) Field of Classification Search
CPC .... B01D 71/64; B01D 67/0034; B01D 69/06; B01D 69/10; B01D 2325/02; B01D 2325/08
See application file for complete search history.

(56) References Cited

U.S. PATENT DOCUMENTS 5,759,745 A * 6/1998 Hollingsworth ...... G03F 7/0042
430/313
7,784,619 B2   8/2010 Jacobson

FOREIGN PATENT DOCUMENTS

DE   102013203050 A1   8/2014
WO        0141905 A1   6/2001

OTHER PUBLICATIONS

Search Report received in International Application No. PCT/EP2021/058779 dated Jul. 15, 2021, 4 pages.
Written Opinion received in International Application No. PCT/EP2021/058779 dated Jul. 15, 2021, 9 pages.

* cited by examiner

*Primary Examiner* — Krishnan S Menon
(74) *Attorney, Agent, or Firm* — Jeff B. Vockrodt; Culhane Meadows, PLLC

(57) ABSTRACT

Porous membranes are provided according to the invention having desirable coefficient of thermal expansion and large surface area, for example at least about 4,000 mm². These porous membranes may be made according to an exemplary process employing lithographic patterning of a photoresist followed by development of the photoresist and etching. In one aspect, the etch barrier layer is chosen from a material that does not react with or incorporate metal or other contaminants into the membrane layer.

13 Claims, 6 Drawing Sheets

POROUS FLAT DEFORMATION-RESISTANT MEMBRANE

BACKGROUND OF THE INVENTION

Porous membranes are used in various biological filtration processes. The membranes are made from a thin layer of polymeric material with holes that are formed in the material. One such material is prepared by a process called Track-Etch, which is shown in FIG. 1. The Track-Etch material is made using an electron gun. Electrons are directed toward the membrane under vacuum conditions. The electrons produce holes in the membrane resulting in a porous the membrane. Owing to the randomness of the process, the resulting holes are distributed randomly in the membrane surface. There is a possibility that the process results in some holes that are larger than intended due to overlap in the holes.

Photolithography has been used to make a membrane material. U.S. Pat. No. 7,784,619 to Jacobsen and assigned to Baxter International, Inc. describes a photolithographic method for making a membrane. These processes used conventional semiconductor manufacturing techniques to make membrane having a desired series of holes.

The present inventors have found that standard techniques for semiconductor manufacturing are incapable of providing large surface area membranes having desirable properties. It is difficult to produce a large surface area membranes that lay flat on a surface. One problem is curling of the membrane material after it is detached from the support. Other issues include contamination of the membrane from the hard mask layer, which is necessary to produce high aspect ratio holes in the membrane. In some applications it may be desirable to produce a membrane free of metallic contaminants.

Accordingly, the present invention seeks to improve microporous membranes and their methods of manufacture.

SUMMARY OF THE INVENTION

In one aspect, the invention comprises a liquid-filtering porous membrane, the porous membrane comprising a polymeric membrane layer, the polymeric membrane layer has an average pore diameter ranging from 1 to 100 microns, a pore diameter standard deviation of less than or equal to 0.7 microns, and a deviation ratio of 0.2 or less. The membrane desirably has a larger surface area, such as at least 4,000 mm$^2$. The pore size distribution according to an aspect of the invention may be controlled to be less than 0.3 microns. In another aspect, the pore size distribution has a standard deviation that ranges from 0.15 to 0.7 microns, more preferably from 0.15 to 0.40 microns, or 0.15 to 0.30 microns.

The polymeric membrane may be made from a variety of polymers such as polyimide, polyamide, polycarbonate, polyetherimide, polyether ketone, polyurethane, synthetic polymers, low-density polyethylene (LDPE), high-density polyethylene (HDPE), polypropylene (PP), polyvinyl chloride (PVC), polystyrene (PS), nylon, teflon (polytetrafluoroethylene), thermoplastic polyurethanes (TPU), polyethylene, acrylate polymers, acrylate monomers, or acrylate elastomers. In a preferred aspect, the polymeric material is polyimide.

In another aspect, the invention relates to a method for making a liquid-filtering porous membrane comprising: a) depositing a photoresist layer on the top surface of a substrate, the substrate comprising a support layer, a polymer layer, and a hard mask layer, wherein the polymer layer has a thickness of between 5 to 25 microns and a substrate layer and the polymer layer have a matched coefficient of thermal expansion that is within ±25% relative to each other; b) exposing the photoresist to a pattern of light; c) developing the photoresist layer to provide a first pattern of openings in the photoresist layer that expose portion of the hard mask layer; d) etching the exposed portions of the hard mask layer to provide a second pattern of openings in the hard mask layer that expose portions of the underlying polymer layer; e) removing the photoresist; f) etching the polymer layer through the openings in the hard mask layer thereby providing a third pattern of openings in the polymer layer; g) removing the hard mask layer; and h) releasing the polymer layer from the substrate, thereby providing the porous membrane, wherein the pore dimensions of the porous membrane are defined by the pattern of light and membrane has a surface area of at least 4,000 mm$^2$.

In another aspect the invention relates to a porous membrane, the porous membrane comprising a polymer layer having a contiguous surface area of at least 4,000 mm2, a thickness of between 5 and 25 microns, and a pattern of openings wherein the median aspect ratio of the openings ranges from 0.5:1 to 20:1, and the polymer lacks detectable amounts of hard mask material or reaction products of the hard mask layer with the polymer. In one aspect, the porous membrane as the ability to lay flat, having a deviation ratio of 0.2 or less.

In another aspect, the invention involves a method for making a porous membrane comprising: a) depositing a photoresist layer on the top surface of a substrate, the substrate comprising a support layer, a polymer layer, and a hard mask layer, wherein the polymer layer has a thickness of between 5 to 25 microns and a surface area of the substrate is at least 4,000 mm2, wherein the hard mask and polymer do not form a reactive layer at their interface; b) exposing the photoresist to a pattern of light; c) developing the photoresist layer to provide a first pattern of openings in the photoresist layer that expose portion of the hard mask layer; d) etching the exposed portions of the hard mask layer to provide a second pattern of openings in the hard mask layer that expose portions of the underlying polymer layer; e) removing the photoresist; f) etching the polymer layer through the openings in the hard mask layer thereby providing a third pattern of openings in the polymer layer, wherein the wherein the median aspect ratio of the third pattern of openings ranges from 0.5:1 to 20:1; g) removing the hard mask layer wherein the polymer layer after removal of the hard mask layer lacks detectable amounts of hard mask material or reaction products of the hard mask layer with the polymer; and h) releasing the polymer layer from the substrate, thereby providing the porous membrane, wherein the pore dimensions of the porous membrane are defined by the pattern of light and membrane has a surface area of at least 4,000 mm$^2$. The coefficients of thermal expansion between the polymer layer and the substrate may be controlled to within ±15% relative to each other. More preferably, the CTE is controlled to be within ±10% relative to each other.

DETAILED DESCRIPTION OF THE INVENTION

The present invention involves production of a polymeric membrane using photolithographic methods, where the membrane material can be made to have a contiguous surface area of over 4,000 mm$^2$ that is capable of being laid flat without curling or other deformation.

The membranes of the present invention can be made to have a desired pore diameter and distribution, while maintaining a large contiguous surface area.

The process of the present invention is capable of producing biocompatible membranes and use materials and techniques that avoid leaving residual components in the polymeric material after processing. For example, the etching mask is chosen from a material that does not react with components of the polymer such as carbon. Avoiding these surface reactions is important for biological membranes that must not contaminate materials they are intended to filter. The hard mask material and etching conditions may be chosen in order to minimize the level of residual hard mask material found in the membrane. The residual material includes elemental impurities from the hard mask material, including for example aluminum or silicon elements. In one embodiment, the membrane comprises a biologically insignificant amount of residual hard mask material. The amount of hard mask material on the surface of the polymer in one embodiment is preferably at or below 0.15 μg/cm$^2$, more preferably below 0.10 μg/cm$^2$, and most preferably below 0.01 μg/cm$^2$.

Figure 1:
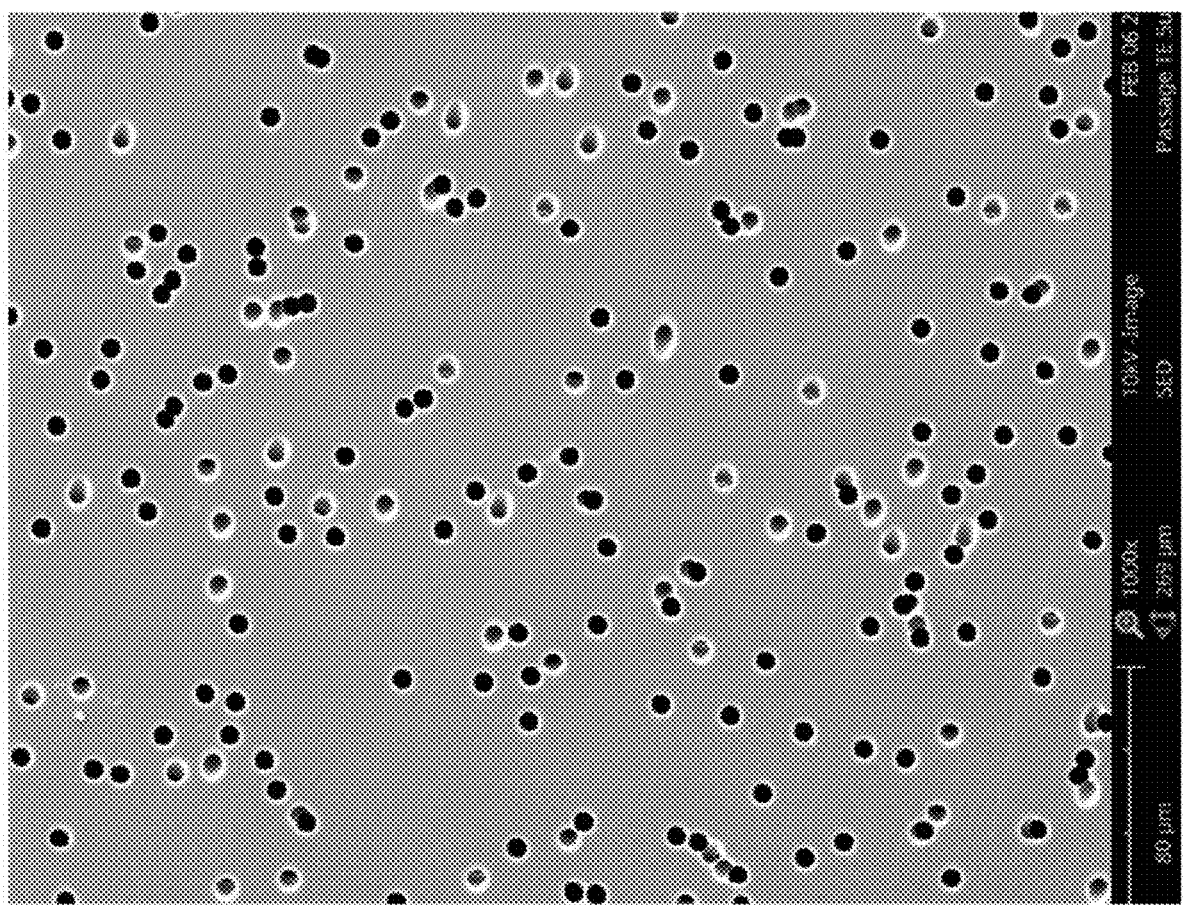
FIG. 1 shows the surface of a porous membrane that is made according to a track etch process.
Figure 2:
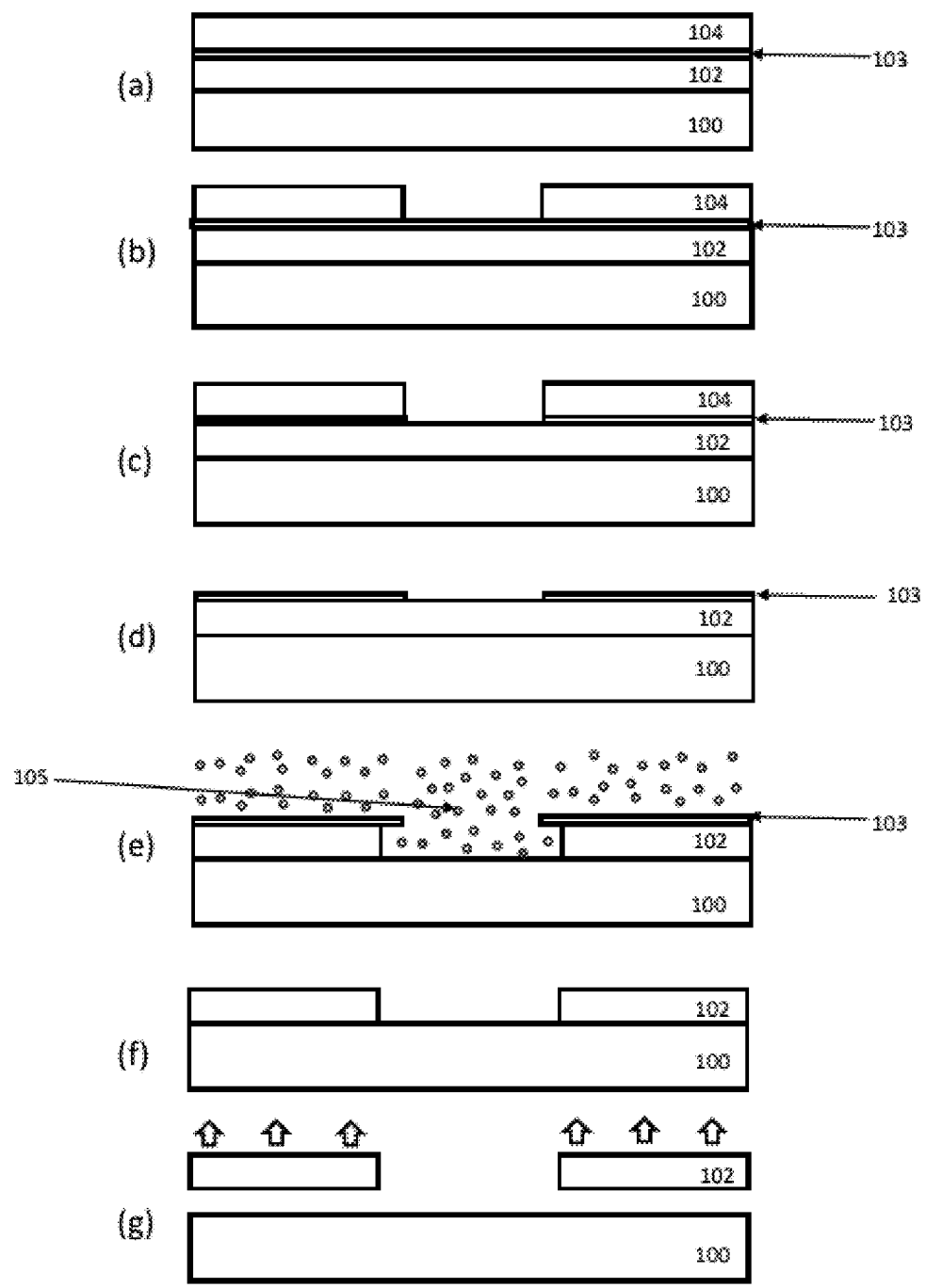
FIG. 2 shows the steps for manufacturing the membrane according to an embodiment of the present invention.

As shown in FIG. 2, one exemplary process for making the membranes of the present invention first involves providing base substrate layer 100. A membrane layer 102 is formed on the base layer 100. A hard mask layer 103 is formed on the polymer layer 102. And a photomask layer 104 is provided on the hard mask layer 103.

The base substrate 100 may be made from glass, for example. Other suitable materials include silicon or metal. The membrane layer 102 is a polymer layer. In one preferred aspect of the invention, the membrane layer 102 and base 100 have a similar coefficient of thermal expansion. The inventors have observed that when the thermal expansion characteristics of the polymer layer 102 and base layer 100 are matched, the resultant membrane resists deformation. This is a desirable property because membranes that lay flat are easier for end-users to work with. One desirable material with a CTE similar to glass is polyimide. In one aspect, polyimide is applied to and cured on a substrate where the CTE of the cured polyimide substrate matches that of the glass. The inventors have found that the greater the difference between the glass and polymer membrane layer (e.g., polyimide), the more likely it is that the polymer will not lay flat when released from the glass.

In one embodiment, the polyimide has a CTE of 3 ppm/° C. between 50° C. and 200° C. at a 20 micron thickness, and the glass has a CTE of 3.2 ppm/° C. between 50° C. and 200° C. As noted above the CTE of the polymer and base layer should be within a range of ±25% of each other, more preferably ±15% of each other, and most preferably within ±10%. For example, as noted above the CTE of glass is about 7% higher than that of the polyimide layer.

Suitable materials for the membrane layer 102 may include polyimide, polyamide, polycarbonate, polyetherimide, polyether ketone, polyurethane, synthetic polymers, low-density polyethylene (LDPE), high-density polyethylene (HDPE), polypropylene (PP), polyvinyl chloride (PVC), polystyrene (PS), nylon, teflon (polytetrafluoroethylene), thermoplastic polyurethanes (TPU), polyethylene, acrylate polymers, acrylate monomers, or acrylate elastomers. The membrane layer 102 may be coated onto the base 100 using spin coating, spray coating, meniscus coating, slot die coating, dip coating, extrusion coating, lamination (with adhesive attachment to substrate). The membrane layer 102 may be cured using thermal curing, UV curing, or a combination of both.

The hard mask layer 103 is typically an inorganic material that can be etched selectively relative to polymeric material, such as the membrane layer or the photomask layer. The inorganic layer is desirably made from a material that does not react in any way with the membrane layer 102. For example, although aluminum is a well-known etching mask layer, Al may react with polyimide of the membrane layer to form Al—C. This is undesirable as any metal contamination would likely render the membranes incompatible with bioprocess applications. Preferably, the hard mask layer is made from an aluminum alloy that exhibits little or no reaction with the polymer of the underlying membrane layer 102. The hard mask layer 103 may be deposited using one or more of physical vapor deposition, evaporation, chemical vapor deposition, and/or spray coating.

Suitable hard mask materials include inorganic material, organic material, multilayer of inorganic and organic materials. More specifically, the hard mask materials may include metals, insulators, semiconductors, photoresists, inorganic materials, organic materials, multilayer films or combinations thereof. In certain embodiments, the hard mask may include hydrogenated amorphous SiN (SiN:H) or hydrogenated amorphous SiO (SiO:H). The hard mask may be deposited using physical vapor deposition, evaporation, chemical vapor deposition, spray coating, plating, lamination, spin coating, spray coating, meniscus coating, slot die coating clip coating, or extrusion coating.

The photoresist layer 104 is desirably a photoresist material that can be exposed and pattered using lithography techniques commonly used for semiconductor and flat panel display manufacturing. The photoresist material can be either a positive or negative photoresist. The photoresist material is typically deposited using a spinning technique to a desired thickness and then cured. The photoresist is then subjected to a pattern of light that determines the pattern of the photoresist material upon development of the photoresist. A positive photoresist leaves material in regions not exposed to light, and is removed upon development in regions exposed to light. A negative photoresist is the opposite. Namely, a negative photoresist remains in regions exposed to light, and is removed in regions not exposed to light upon development.

Figure 3:
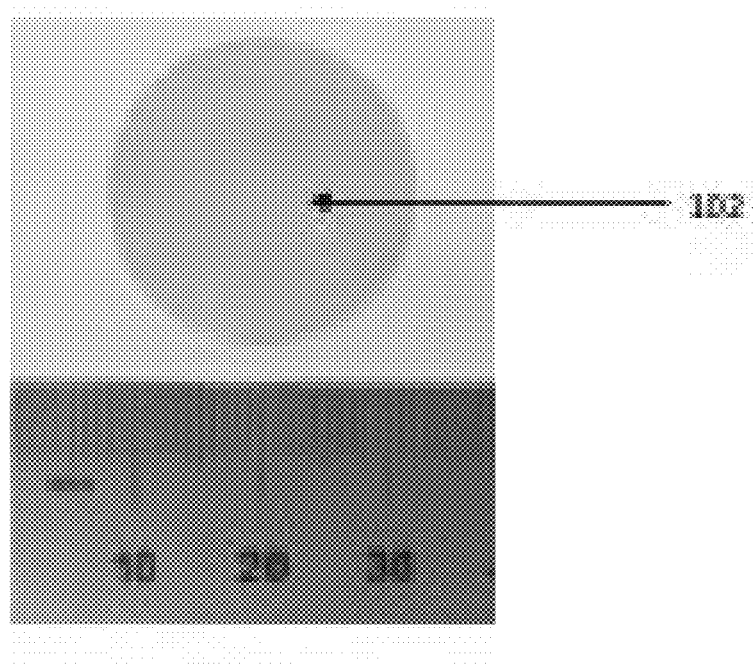
FIG. 3 shows a picture of a membrane according to an embodiment of the present invention.

The structure shown in FIG. 2(a) represents a cross section of the base 100, membrane layer 102, the hardmask layer 103, and the photoresist layer 104. This material may be either made at the time it is patterned, or made in advance and patterned at a later time. The overall shape is not critical, and may be in the form of a disc, a square, or a rectangle. FIG. 3 shows a disc shaped membrane on a support structure. The present invention may be used to provide large area porous membranes, including those having a surface area exceeding 4,000 mm$^2$.

The first step in making the membrane from the structure of FIG. 2(a) is to provide a patterned photoresist layer 104 by exposing the surface of the photoresist to a light pattern, and developing the photoresist to leave the photoresist pattern shown in FIG. 2(b). The location of light exposure depends on whether a positive or negative photoresist is used. The photoresist 104 in FIG. 2(b) includes an opening 101 in the photoresist layer. The opening 101 in the photoresist layer 104 is formed upon development after exposing the photoresist 104 to a light pattern.

After forming the opening 101, the hard mask 103 is etched in the location of the opening 101 to form the hard mask opening 106 as shown in FIG. 2(c). The etching of the hard mask 103 may be performed using one or more of wet chemical etch, plasma etch, non-reactive sputtering, or combinations of the these techniques. In one aspect, the hard mask is etched using a combination of acetic acid, phosphoric acid, nitric acid, and water. In one aspect, the hard mask layer is etched with ammonium fluoride (NH$_4$F) and hydrofluoric acid (HF). In another aspect, the hard mask layer may be removed using laser ablation. The etching is often conducted at elevated temperature. As noted above, the material of the hard mask layer should be chosen to be non-reactive with the underlying polymer of the membrane layer 102 at the temperatures encountered during processing, include etching of the hard mask 103.

It should be appreciated that the hard mask layer is critical to providing a mask for the subsequent etching of holes in the membrane layer 102. Although hard mask materials are known, many existing hard mask materials will react with carbon in the underlying membrane layer 102. For instance, the present inventors have observed that Al—C is formed in the membrane layer when aluminum is used as a hard mask on a polyimide film. These reactions take place in part because the elevated temperature at which the substrate is exposed during manufacture. For these reasons, it is desirable to use a hard mask material free of potential metal contaminants, such as SiN or SiH as noted above.

After patterning of the hard mask layer 103 to form opening 106, the photoresist may be removed using an NMP-based solvent or the like, and then the membrane layer 102 can be patterned to form opening 107. The patterning of the membrane layer 102 through the hard mask opening 106 is shown in FIG. 2(e). This is an etching process designed to selectively remove the polymeric membrane layer within the hard mask opening 106. The etching technique may include a wet chemical etch, plasma etch, non-reactive sputtering, or combinations of these techniques. Notably, the material must be etched sufficiently to expose the underlying base layer 100 through the membrane layer opening 107.

After patterning the membrane layer 102 to form the membrane layer opening 107, the hard mask layer 103 should be removed as shown in FIG. 2(f). The removal of the hard mask layer 103 is desirably conducted in a manner that is selective relative to the membrane layer 102.

After removal of the hard mask layer 103, the patterned membrane layer 102 is separated from the base layer 100 as shown in FIG. 2(g). The membrane layer 102 may be released using a mechanical release technique, a laser release technique, a solution-based release technique, or a thermal release technique or combinations of these techniques.

The base layer and membrane layer must be selected to allow for release of the layer after patterning, yet have sufficient adhesion to withstand processing. In one embodiment, the base 100 is made from glass and the membrane layer 102 is polyimide. In a preferred embodiment, the base 100 and membrane 102 are selected to have a similar coefficient of thermal expansion. The present inventors found that matching the CTE of the base 100 and membrane layer 102 is important to provide a flat membrane upon delamination from the base. Where the CTE is not matched, the membrane will tend to curl upon delamination which is undesirable.

The membrane 102 may be separated from the base 100 using a mechanical process, or a combination of chemical and mechanical processes. The membrane for instance may be removed using a laser liftoff (LLO) technique. Alternatively, or in addition, the membrane can include a de-bonding layer (DBL) intermediate the membrane 102 and the base layer 100. In a preferred aspect a membrane 102 layer and base 100 layer are chosen so that they be easily separated without using LLO or a DBL.

Figure 4:
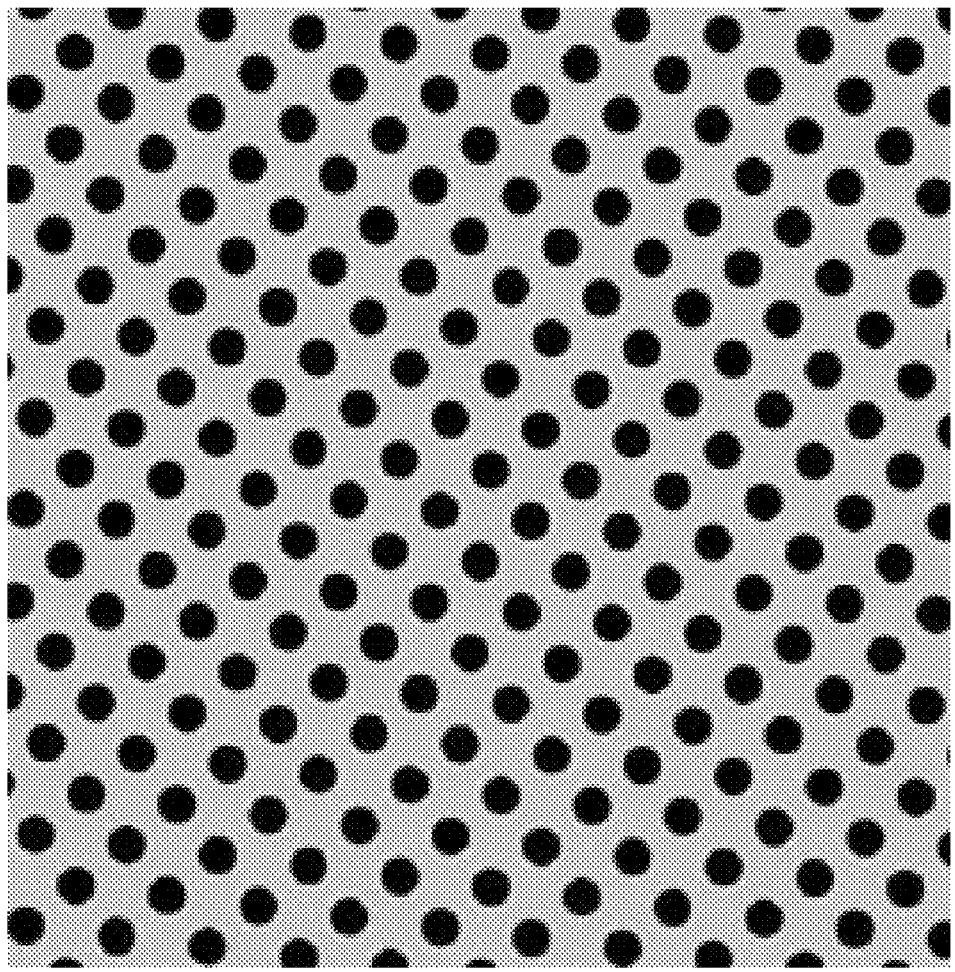
FIG. 4 shows a scanning electron microscope image of a membrane according to an embodiment of the present invention.

FIG. 4 shows a scanning electron microscope image of a membrane according to an embodiment of the present invention. The pores can be made into a regular pattern using the lithography techniques described herein. Any desired pattern is possible. However, one advantage of using a lithographic technique is that problems associated with overlapping pores resulting from a random process can be avoided. Moreover, in one embodiment, any symmetrical pore shape on x-y direction can be proportionally reproduced along the z-direction through the thickness of the film. For example, any symmetrical pore shape on x-y direction can be extruded along the z-direction with or without a draft angle. This can be used to avoid complex pore shapes in the z-direction & triple-point symmetries, i.e. gyroid geometries, that can naturally arise when a suitable hardmask cannot be used.

In one embodiment the pores are designed to have a diameter ranging from 1-100 microns, more preferably within the range of 1-10 microns, more preferably within the range of 3-7 microns, and most preferably about 5 microns. The thickness of the membrane together with the diameter of the pores determines the aspect ratio of the pores. The thickness of the membrane will often be within the range of 5 to 25 microns. The aspect ratio may range from 0.5:1 to up to 20:1, preferably between 1:1 to 10:1, more preferably between 2:1 to 5:1 and most preferably about 3:1. In one aspect, the present invention is capable of producing membranes having pore size distributions of desired size with low variability. In one aspect, the variability may be characterized as pore size standard deviation. The standard deviation of pore size is desirably less than 0.70 microns, and more desirably less than 0.50 microns, still more desirably less than 0.30 microns. In another aspect the standard deviation of pore size may range from between 0.1 to 0.5 microns, more desirably between 0.15 and 0.4 microns, and more preferably between 0.15 and 0.3 microns. Table 1 shows pore size and standard deviation of membranes according to the present invention:

TABLE 1

| Design values | | Present | | |
|---|---|---|---|---|
| Hard mask hole size (μm) | Pore-to-pore pitch distance (μm) | invention membrane ID | Pore size (exact) (μm) | stdev (exact) (μm) |
| 5 μm | 17.5 μm | Sample 1 | 5.42 | 0.24 |
| 5 μm | 17.5 μm | Sample 2 | 5.27 | 0.28 |
| 5 μm | 25 μm | Sample 3 | 5.67 | 0.39 |

TABLE 1-continued

| Design values | | Present | | |
|---|---|---|---|---|
| Hard mask hole size (μm) | Pore-to-pore pitch distance (μm) | invention membrane ID | Pore size (exact) (μm) | stdev (exact) (μm) |
| 5 μm | 25 μm | Sample 4 | 5.63 | 0.32 |
| 5 μm | 35 μm | Sample 5 | 5.47 | 0.33 |
| 5 μm | 35 μm | Sample 6 | 5.17 | 0.23 |
| 8 μm | 25 μm | Sample 7 | 10.32 | 0.23 |
| 8 μm | 25 μm | Sample 8 | 9.97 | 0.45 |
| 8 μm | 35 μm | Sample 9 | 11.26 | 0.18 |
| 8 μm | 35 μm | Sample 10 | 10.79 | 0.19 |
| 8 μm | 50 μm | Sample 11 | 11.01 | 0.18 |
| 8 μm | 50 μm | Sample 12 | 10.82 | 0.70 |

These results were based on 15 measuring points on each 100×150 mm sheet. A few areas were observed where smaller holes, which suggests there may have been debris closing up the pores. The presence of a few larger pores appear to have resulted from faults in the mask. During production, faults in the mask may be remedied by replacing the mask.

The membranes of the present invention have a pore size distribution that can reliably separate materials based on size. The retention efficiency of the membranes were determined by challenging the membrane with suspensions of uniform particles (polystyrene microspheres) of a known size and concentration and then quantifying the particles able to pass through the membrane (downstream of the membrane). Polystyrene beads used in these tests were non-functionalized and un-dyed. Three bead size distributions with nominal sizes of 6, 10 and 12 microns were tested. The comparative membrane was GE Healthcare TEM Nucleopore nominal size 10 um. The membrane of present invention used in the test had an exact size 10.3 μm±0.2 μm (statistical evaluation based on SEM microscopy images). As shown in Table 2, the membrane of the present invention exhibited a very low standard deviation in mean retention compared to the commercially available track-etch membranes, showing the reliability of the membranes of the present invention in terms of pore size reproducibility.

TABLE 2

| Sample | Pore size [μm] | 6 μm latex beads challenge | | 10 μm latex beads challenge | | 12 μm latex beads challenge | |
|---|---|---|---|---|---|---|---|
| | | Mean retention | stdev | Mean retention | stdev | Mean retention | stdev |
| Nucleopore | 10 (nominal) | 0% | 0% | 89% | 15% | 85% | 20% |
| Present invention membrane | 10.3 μm ± 0.2 (exact) | 0% | 1% | 86% | 2% | 100% | 0% |

The porous membrane of the present invention has the desirable property that it does not curl after delamination from the support. This feature becomes more critical as the surface area of the membranes being produced increases. For example, when the surface area of the membrane is 4,000 mm$^2$ or greater, the inventors have observed the tendency of the membrane to curl after delamination from the base. Prior attempts at developing porous membranes with photolithography/etching utilized polymer layers having an undefined coefficient of thermal expansion making it difficult to produce them without curling upon delamination, particularly at the large surface areas claimed. These limitations severely limited the size in surface area of the membranes.

Figure 5:
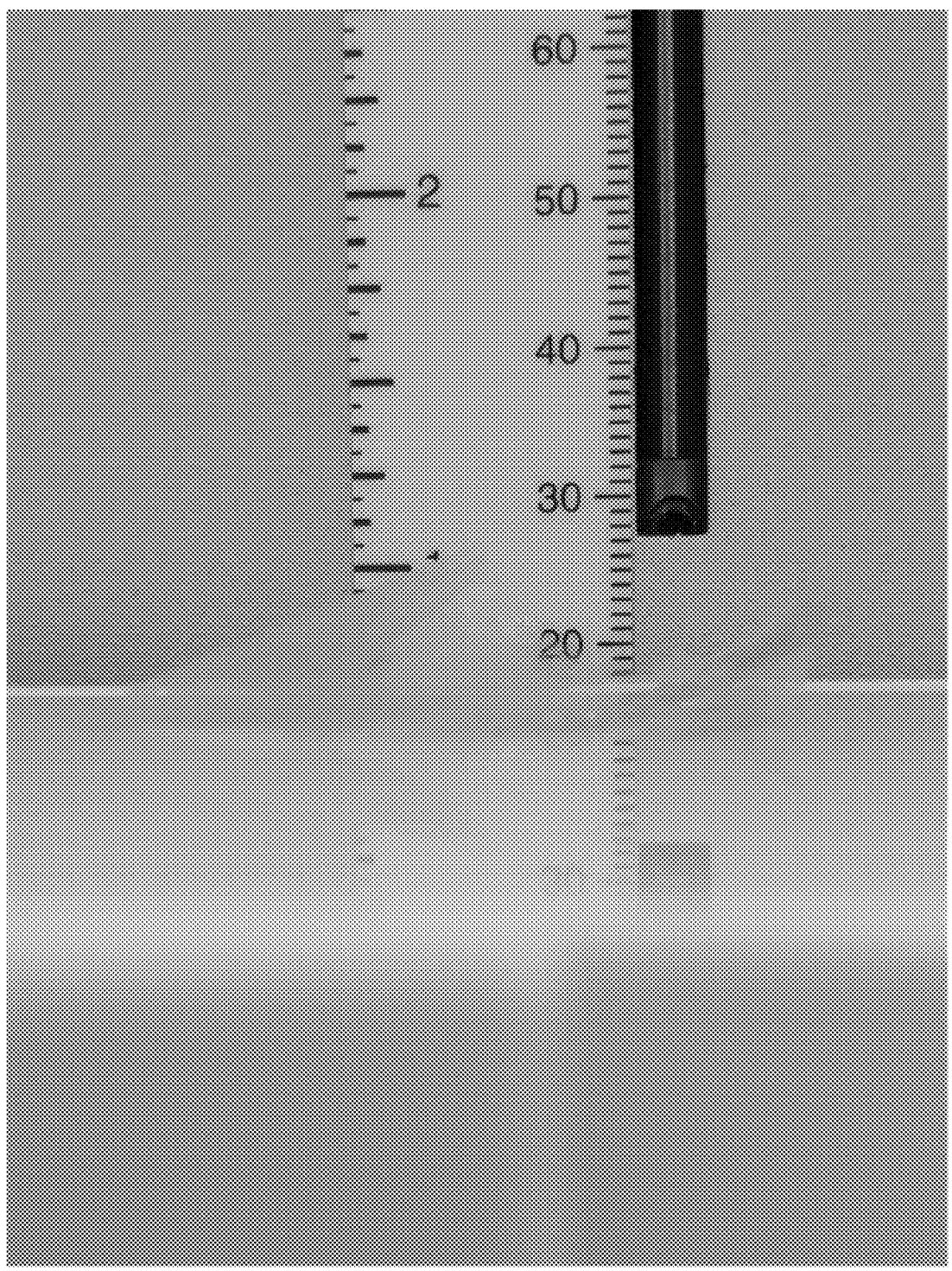
FIG. 5 shows a polyimide film prepared without controlling the CTE of the support layer and polymer layer.
Figure 6:
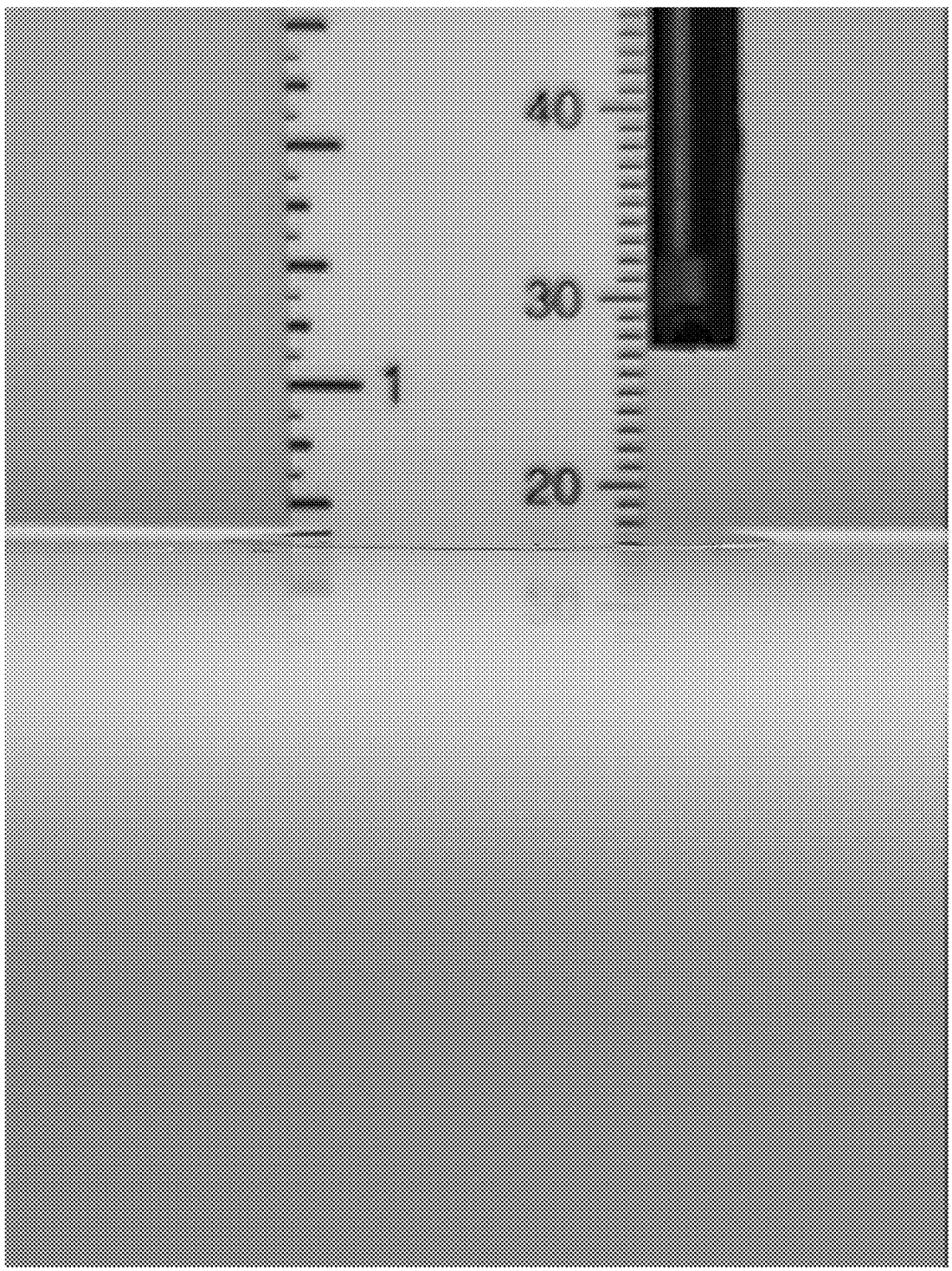
FIG. 6 shows a polyimide film prepared in accordance with an aspect of the invention where the CTE of the support layer and polymer layer are controlled to be within 25% of each other.

The desired level of deviation, or the deviation ratio calculated as the ratio of maximum deviation from the flat plane when the membrane is self-supporting, divided by length of that membrane across the flat surface, is 0.2 or less. FIG. 5 shows a membrane in which the deviation valve is 0.22, calculated as 10 mm curl divided by 47 mm diameter max. This level of deviation ratio resulted from lack of control of the CTE of the substrate and polymer layer, whereupon separation of the polymer layer resulted in a curly film. FIG. 6 shows a membrane according to an embodiment of the invention where the deviation was 0.04, or in other words less than 1 mm deviation over 25 mm diameter.

Jurkat cells (human lymphoma) were cultured in RPMI medium supplemented with fetal bovine serum and an antibiotic complex (streptomycin and penicillin), and passaged twice before being utilized in experimentation. Cells were cultured as they were (control), as well as in the presence of GE Healthcare TEMNucleopore and present invention membranes for a total of 7 days, constantly monitored and kept in the exponential phase of growth (controlled directly through cell number control). Cell viability in all groups (control, Track Etch and present invention membrane) was deduced quantitatively using the Nucleocounter 200 (Chemometec) and it is respective via-1 cassette consumables, at days 1 and 7, as shown in Table 3.

TABLE 3

| | % Viability Day 1 | % Viability Day 7 |
|---|---|---|
| Control | 95.8 | 95.4 |
| TEM Nucleopore | 95.4 | 96.4 |
| Present Invention Membrane | 95.4 | 96.8 |

The results show no difference in viability of Jurkat cells cultured in the presence of the membranes and the control, hence no cytotoxicity.

Other embodiments and uses of the invention will be apparent to those skilled in the art from consideration of the specification and practice of the invention disclosed herein. All references cited herein, including all U.S. and foreign patents and patent applications, are specifically and entirely hereby incorporated herein by reference. It is intended that the specification and examples be considered exemplary only, with the true scope and spirit of the invention indicated by the following claims

What is claimed is:

1. A method for making a liquid-filtering porous membrane comprising:
    a) depositing a photoresist layer on the top surface of a substrate, the substrate comprising a support layer, a polymer layer, and a hard mask layer, wherein the polymer layer has a thickness of between 5 to 25 microns and the polymer layer being of polyimide having a matched coefficient of thermal expansion that is within ±25% relative to the support layer;
    b) exposing the photoresist to a pattern of light;
    c) developing the photoresist layer to provide a first pattern of openings in the photoresist layer that expose portion of the hard mask layer;

d) etching the exposed portions of the hard mask layer to provide a second pattern of openings in the hard mask layer that expose portions of the underlying polymer layer;

e) removing the photoresist;

f) etching the polymer layer through the openings in the hard mask layer thereby providing a third pattern of openings in the polymer layer;

g) removing the hard mask layer; and h) releasing the polymer layer from the support layer, thereby providing the porous membrane, wherein the pore dimensions of the porous membrane are defined by the pattern of light and membrane has a surface area of at least 4,000 mm$^2$, wherein the hard mask layer comprises hydrogenated amorphous SiN (SiN:H) or hydrogenated amorphous SiO (SiO:H).

2. The method of claim 1, wherein the matched coefficients of thermal expansion are within ±15% relative to each other.

3. The method of claim 1, wherein the matched coefficients of thermal expansion are within ±10% relative to each other.

4. The method of claim 1, wherein the membrane has a surface area of at least 0.1 m$^2$.

5. The method of claim 1, wherein the membrane has a level of residual hard mask material that is at most 0.15 μg/cm$^2$.

6. The method of claim 1, wherein the pores have an aspect ratio of 0.5:1 to 20:1.

7. The method of claim 1, wherein the support layer is a glass support layer.

8. A method for making a liquid-filtering porous membrane comprising:

a) depositing a photoresist layer on the top surface of a glass substrate, the substrate comprising a support layer, a polymer layer, and a hard mask layer, wherein the polymer layer has a thickness of between 5 to 25 microns and the polymer layer being of polyimide having a matched coefficient of thermal expansion that is within ±25% relative to the glass substrate, the hard mask layer comprising hydrogenated amorphous SiN (SiN:H) or hydrogenated amorphous SiO (SiO:H);

b) exposing the photoresist to a pattern of light;

c) developing the photoresist layer to provide a first pattern of openings in the photoresist layer that expose portion of the hard mask layer;

d) etching the exposed portions of the hard mask layer to provide a second pattern of openings in the hard mask layer that expose portions of the underlying polymer layer;

e) removing the photoresist;

f) etching the polymer layer through the openings in the hard mask layer thereby providing a third pattern of openings in the polymer layer;

g) removing the hard mask layer; and h) releasing the polymer layer from the support layer, thereby providing the porous membrane, wherein the pore dimensions of the porous membrane are defined by the pattern of light and membrane has a surface area of at least 4,000 mm$^2$.

9. The method of claim 8, wherein the matched coefficients of thermal expansion are within ±15% relative to each other.

10. The method of claim 8, wherein the matched coefficients of thermal expansion are within ±10% relative to each other.

11. The method of claim 8, wherein the membrane has a surface area of at least 0.1 m$^2$.

12. The method of claim 8, wherein the membrane has a level of residual hard mask material that is at most 0.15 μg/cm$^2$.

13. The method of claim 8, wherein the pores have an aspect ratio of 0.5:1 to 20:1.

* * * * *